US006867983B2

(12) United States Patent
Liu et al.

(10) Patent No.: US 6,867,983 B2
(45) Date of Patent: Mar. 15, 2005

(54) RADIO FREQUENCY IDENTIFICATION DEVICE AND METHOD

(75) Inventors: Peikang Liu, Claremont, CA (US); Scott Wayne Ferguson, Arcadia, CA (US); Dave N. Edwards, Arcadia, CA (US); Yukihiko Sasaki, Claremont, CA (US)

(73) Assignee: Avery Dennison Corporation, Pasadena, CA (US)

( * ) Notice: Subject to any disclaimer, the term of this patent is extended or adjusted under 35 U.S.C. 154(b) by 0 days.

(21) Appl. No.: 10/214,066

(22) Filed: Aug. 7, 2002

(65) Prior Publication Data

US 2004/0026754 A1 Feb. 12, 2004

(51) Int. Cl.[7] .................. H05K 5/00; B41M 3/12; H01L 23/495
(52) U.S. Cl. ............... 361/761; 361/737; 361/766; 428/901; 257/673; 257/692; 257/735
(58) Field of Search .................. 257/666, 673, 257/692, 735, 773, 786; 361/737, 761, 766; 428/901; 438/706, 708, 710, 714, 723, 745, 756, 717

(56) References Cited

U.S. PATENT DOCUMENTS

| 4,478,769 A | 10/1984 | Pricone et al. |
| 4,486,363 A | 12/1984 | Pricone et al. |
| 4,601,861 A | 7/1986 | Pricone et al. |
| 4,633,567 A | 1/1987 | Montalbano |
| 4,900,618 A | 2/1990 | O'Connor et al. |
| 4,910,072 A | 3/1990 | Morgan et al. |
| 5,075,037 A | 12/1991 | Morgan et al. |
| 5,087,510 A | 2/1992 | Tokas et al. |
| 5,153,983 A | 10/1992 | Oyama |
| 5,158,604 A | 10/1992 | Morgan et al. |
| 5,227,223 A | 7/1993 | Morgan et al. |
| 5,316,974 A | 5/1994 | Crank |
| 5,328,750 A | 7/1994 | Morgan et al. |
| 5,349,236 A | 9/1994 | Oshino et al. |
| 5,403,649 A | 4/1995 | Morgan et al. |
| 5,437,916 A | 8/1995 | Morgan et al. |
| 5,541,570 A | 7/1996 | McDowell |
| 5,545,291 A | 8/1996 | Smith et al. |
| 5,564,888 A | 10/1996 | Doan |
| 5,783,856 A | 7/1998 | Smith et al. |
| 5,824,186 A | 10/1998 | Smith et al. |
| 5,904,545 A | 5/1999 | Smith et al. |
| 5,919,402 A | 7/1999 | Murphy et al. |
| 5,969,422 A | 10/1999 | Ting et al. |

(List continued on next page.)

FOREIGN PATENT DOCUMENTS

| EP | 0 194 495 A1 | 4/1981 |
| EP | 0 587 725 B1 | 5/1992 |
| EP | 1 024 523 A1 | 1/1999 |
| EP | 1 039 543 A2 | 3/2000 |
| JP | 10-25594 | 1/1998 |
| JP | 11-121905 | 4/1999 |
| JP | 2001-33734 | 12/2001 |
| JP | 2003223626 | 8/2003 |
| JP | 2003242471 | 8/2003 |
| WO | 91/14975 | 10/1991 |
| WO | 03/056509 | 7/2003 |
| WO | 2004/038793 | 5/2004 |

*Primary Examiner*—Donghee Kang
(74) *Attorney, Agent, or Firm*—Renner, Otto, Boisselle & Sklar, LLP

(57) ABSTRACT

A device, such as a radio frequency identification (RFID) inlay structure for an RFID tag or label, includes a microstructure element, with leads coupling the microstructure element to other electrical or electronic components of the device. The leads may be electroless-plated leads, and may contact connectors of the microstructure element without the need for an intervening planarization layer.

74 Claims, 9 Drawing Sheets

U.S. PATENT DOCUMENTS

| | | |
|---|---|---|
| 6,077,780 A | 6/2000 | Dubin |
| 6,107,920 A | 8/2000 | Eberhardt et al. |
| 6,136,693 A | 10/2000 | Chan et al. |
| 6,143,641 A | 11/2000 | Kitch |
| 6,145,901 A | 11/2000 | Rich |
| 6,206,292 B1 | 3/2001 | Robertz et al. |
| 6,210,537 B1 | 4/2001 | Murphy et al. |
| 6,246,327 B1 | 6/2001 | Eberhardt |
| 6,268,016 B1 | 7/2001 | Bhatt et al. |
| 6,274,497 B1 | 8/2001 | Lou |
| 6,281,038 B1 | 8/2001 | Jacobsen et al. |
| 6,291,896 B1 | 9/2001 | Smith |
| 6,309,580 B1 | 10/2001 | Chou |
| 6,316,278 B1 | 11/2001 | Jacobsen et al. |
| 6,329,213 B1 | 12/2001 | Tuttle et al. |
| 6,337,148 B1 | 1/2002 | Xu et al. |
| 6,350,690 B1 | 2/2002 | Schwartz et al. |
| 6,380,729 B1 | 4/2002 | Smith |
| 6,413,845 B1 * | 7/2002 | Izumi et al. .............. 438/597 |
| 6,417,025 B1 | 7/2002 | Gengel |
| 6,468,638 B2 | 10/2002 | Jacobsen et al. |
| 6,479,395 B1 | 11/2002 | Smith et al. |
| 6,518,885 B1 | 2/2003 | Brady et al. |
| 6,606,247 B2 * | 8/2003 | Credelle et al. ............ 361/737 |
| 2001/0019887 A1 | 9/2001 | Jang et al. |
| 2002/0025689 A1 | 2/2002 | Yang et al. |
| 2003/0029921 A1 | 2/2003 | Akita et al. |
| 2004/0090380 A1 | 5/2004 | Luch |

* cited by examiner

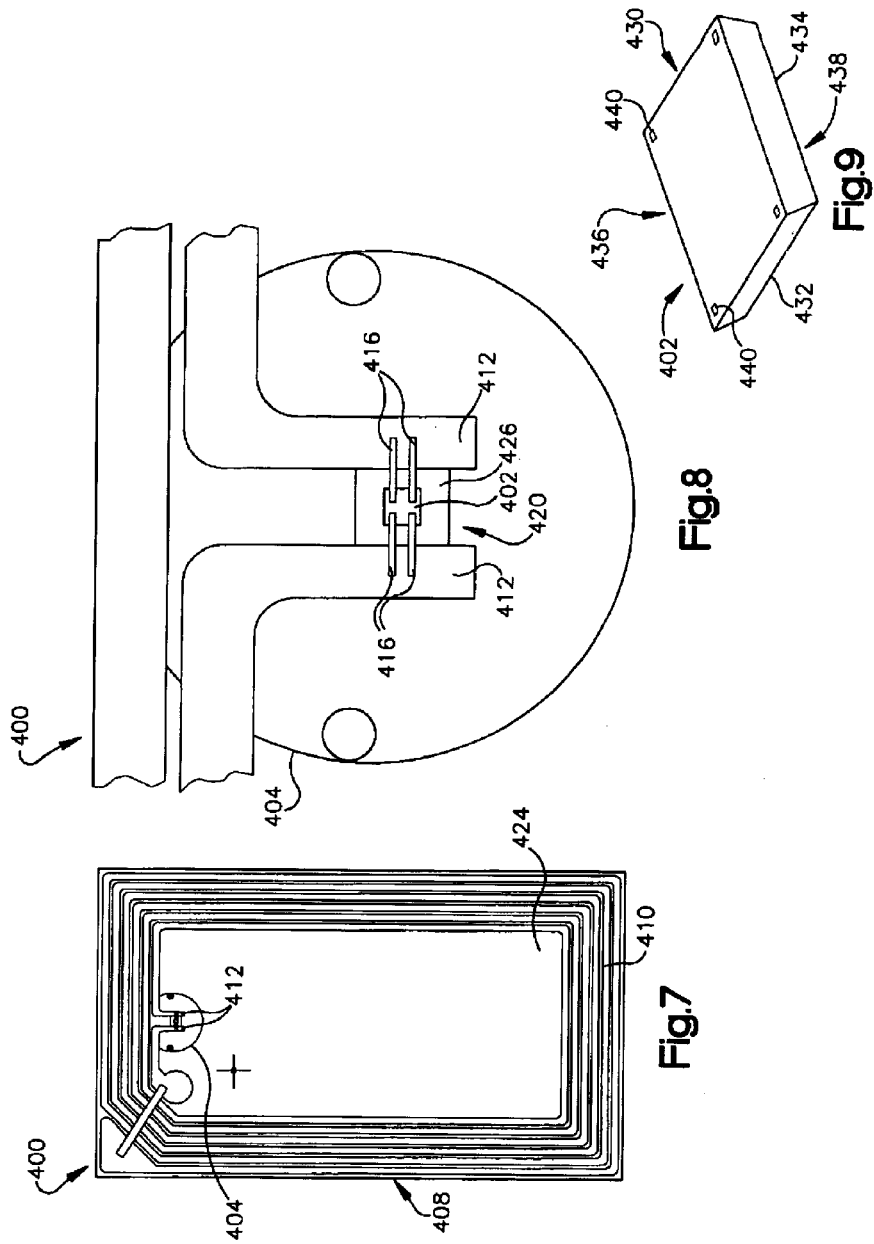

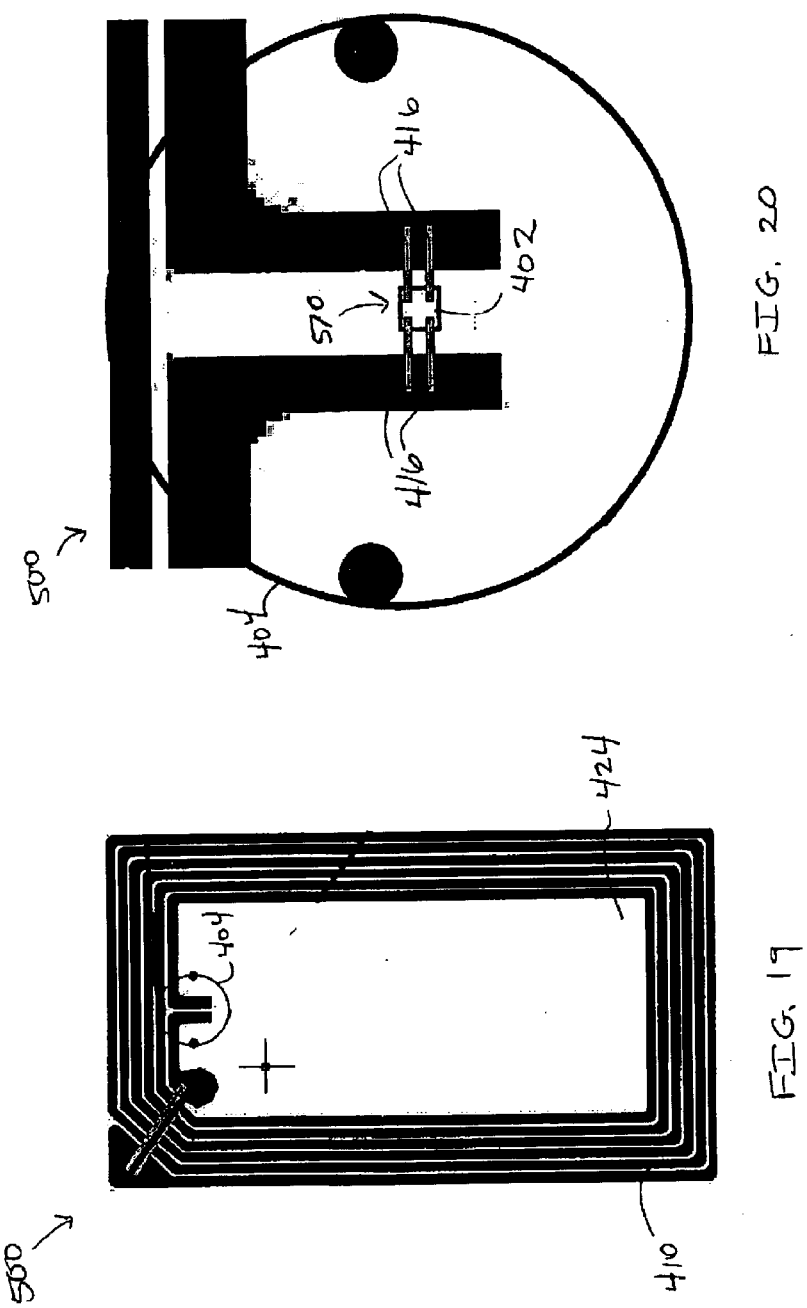

RADIO FREQUENCY IDENTIFICATION DEVICE AND METHOD

BACKGROUND OF THE INVENTION

1. Technical Field

This invention relates to the field of Radio Frequency Identification (RFID) tags and labels, and to particular structures of RFID tags and labels and methods of manufacturing them.

2. Background Art

Alien Technology Corporation ("Alien"), of Morgan Hills, Calif., has developed techniques for manufacturing microelectronic elements as small electronic blocks, which Alien calls "NanoBlocks™," and then depositing the small electronic blocks into recesses on an underlying substrate. To place the small electronic blocks into the recesses, Alien uses a technique known as Fluidic Self Assembly ("FSA"). The FSA method includes dispersing the small electronic blocks in a slurry, and then flowing the slurry over the top surface of the substrate. The small electronic blocks and recesses have complementary shapes, and gravity pulls the small electronics down into the recesses. The end-result is a substrate (e.g., a sheet, a web, or a plate) that is embedded with tiny electronic elements.

There are a number of issued patents which are relevant this technique, including U.S. Pat. Nos. 5,783,856; 5,824,186; 5,904,545; 5,545,291; 6,274,508, 6,281,038, 6,291,896, 6,316,278, 6,380,729, and 6,417,025, all of which the present application incorporates by reference in their entireties. Further information can be found in Patent Cooperation Treaty publications, including WO 00/49421; WO 00/49658; WO 00/55915; WO 00/55916; and WO 01/33621, all of which this application incorporates by reference in their entireties.

FIG. 1 is a simplified flow diagram illustrating a process for embedding a substrate with small electronics using Alien's FSA process. The process starts with CMOS wafers at step 10, which are micromachined into tiny blocks at step 12. These small electronic blocks may be any of a variety of electronic components, such as integrated circuits. The small electronic blocks may be made in a variety of different shapes. FIG. 2 illustrates alternative block shapes 100, 120 and 130. Each is angled on the side, and has an upper portion that tapers down to a narrower lower portion.

Specific examples of small electronic blocks containing microcircuitry and the method of their manufacture are found in the aforementioned Alien Technology patents. The blocks' circuit formation starts with generally standard silicon wafers fabricated by existing IC foundries. The process thereafter separates the wafers into millions of tiny block circuits. A standard backside wafer grind/polish technique is used, and a backside mask defines the block. The blocks are separated from the wafer.

One preferred microstructure block shape comprises a truncated pyramid with a base and four sides. Each side creates an inwardly tapering angle of between about 50° and about 70° with respect to the base, with 54.7° being the preferred angle for the particular device. Each side may also have a height between about 5 $\mu$m (microns) and about 200 $\mu$m. The base also may have a length between about 10 $\mu$m and about 1000 $\mu$m and a width between about 10 $\mu$m and about 1000 $\mu$m.

To receive the small electronic blocks, a planar substrate 200 (FIG. 3) is embossed with numerous receptor wells 210. The receptor wells 210 are typically formed in a pattern on the substrate. For instance, in FIG. 3 the receptor wells 210 form a simple matrix pattern that may extend over only a predefined portion of the substrate, or may extend across substantially the entire width and length of the substrate, as desired.

The substrate material 200 into which the small electronics are to be integrated is typically a plastic film or a glass plate, as noted at step 14 in FIG. 1. At step 16, recesses or holes are formed in the film or plate. The recesses or holes have a shape that is complementary to the shape of the small electronics, such that each small electronic will fit into a corresponding recess or hole.

At step 18, the FSA process is employed to embed the small electronics into the recesses or holes. FIG. 4 illustrates small electronic blocks 100 in slurry 201 that is applied over a sheet or web 200. Gravity will pull a small electronic block into a recess 210 that has a shape that complements the shape of the small electronic block.

During the FSA process, a large number of the microstructure elements 100 are added to a fluid, creating slurry 201 (FIG. 3). The slurry is sprayed on or otherwise flows over the substrate material 200 with the receptor recesses 210. By chance some of the microstructure blocks 100 will fall into and, because of their shape, self align in the recesses 210. Once a microstructure block 100 flows into a recess 210, the microstructure element is retained in the close-fitting recess 210 by hydrodynamic forces. Further details regarding the manufacture of the microstructure blocks and the FSA processes may be found in U.S. Pat. Nos. 5,545,291 and 5,904,545, and PCT/US99/30391 as published at WO 00/46854, the entire disclosures of which are herein incorporated by reference.

After the FSA process, the substrate 200 may be checked for empty recess regions, for example by using an electronic eye attached to a machine capable of viewing the surface of the substrate material. Empty recess regions 210 may be filled, for example as suggested by Alien Technology, by using a robot to place a microstructure element 100 therein.

As FIG. 5 illustrates, the FSA process preferably can be performed as a continuous roll operation by pulling a web of substrate material 200 through a bath of the slurry 201. Vacuum devices 220 and 224 may pull excess fluid and/or impurities off the substrate web 200 at the start and end of the FSA process. Spray devices 222 may be utilized to spray the slurry 201 onto the substrate web 200. The rate at which the slurry 201 is sprayed onto the substrate web 200 may be such that the number of microstructure blocks 100 falling past any given area of the substrate web, is several times the number of the receptor recesses 210 in that area of the substrate material 200.

An excess number of the microstructure blocks 100 may be required in order to obtain full filling of all the receptor recesses 210. The slurry 201 generally may be reused, since the excess microstructure blocks 100 therein generally do not suffer damage by collision with the substrate material or with each other, due to hydrodynamic forces.

One application for a sheet that is embedded with tiny electronic components is to make radio frequency identification (RFID) tags and labels. In ordinary terminology, and as used in the present patent application, a "label" includes a layer of adhesive that "sticks" the label to a substrate, whereas a "tag" has no such adhesive. RFID tags and labels have a combination of antennas, analog and/or digital electronics, and often are associated with software for handling data. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,292, all of which this application incorporates by reference.

Information is stored on the RFID chip. To retrieve the information from the chip, a "base station" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags can also be used to store information that is written onto the RFID chip during process, such as temperatures or other data types, and logistical histories.

The RFID chip may be a part of a radio-frequency identification transponder that is a part of the RFID tag or label. Radio-frequency identification transponders are widely available in a variety of forms. These devices include a non-volatile memory, such as an EEPROM (Electrically Erasable Programmable Read-Only Memory) semiconductor component integrally contained in the transponder. Stored in the non-volatile memory are encoded data. Inlay transponders are identification transponders that have a substantially flat shape. The antenna for an inlay transponder may be in the form of a conductive trace deposited on a non-conductive support. The antenna has the shape of a flat coil or the like. Leads for the antenna are also deposited, with non-conductive layers interposed as necessary. Memory and any control functions are provided by a chip mounted on the support and operatively connected through the leads to the antenna.

The prior art view of FIG. 6 illustrates an article 300 onto which an RFID label 302 has been adhered. The RFID label includes a principal surface 304 onto which text and/or graphics may be printed, such as text 306. The label 302 may be adhered to the substrate 300 by means of a pressure sensitive adhesive, other types of adhesives known in the label art, or, alternatively, by other means of attachment such as by sewing, heat bonding, fusing, or other conventional attachment methods. The RFID label 302 includes the very small RFID chip that is within the label. The face stock 304 may be any face stock known in the art for labels. For example, the face stock 304 might be printable paper, a coated polymer, such as coated Mylar® film, a printable foil, or any other type of face stock used in the label art. Alternatively, in the case of an RFID tag (not shown), the tag could be secured to article 300 using a wide variety of non-adhesive means, such as a plastic fastener, string, wire, etc.

It will be appreciated from the above discussion that many approaches have been undertaken with regard to RFID tags and labels, and that improvements in such tags and labels, and their methods of manufacture, would be desirable.

SUMMARY OF THE INVENTION

According to an aspect of the invention, a method for producing an electronic device, includes the steps of forming leads directly in contact with a substrate; and coupling the leads to connectors of a microstructure element.

According to another aspect of the invention, an electronic device includes a substrate; leads on the substrate; and a microstructure element. The microstructure element includes first and second surfaces on opposite sides of the microstructure element; and connectors on the first surface. The leads are operatively coupled to the connectors. The microstructure element is outside the substrate with the first surface facing the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale:

FIGS. 7 and 8 are plan views of a first embodiment device, an RFID inlay, in accordance with the invention;

FIG. 9 is a perspective view of the configuration of a microstructure element, showing aspects included in the microstructure element used in the device of FIGS. 7 and 8;

FIGS. 19 and 20 are plan views of a second embodiment device, an RFID tag, in accordance with the invention;

DETAILED DESCRIPTION

Figure 1:
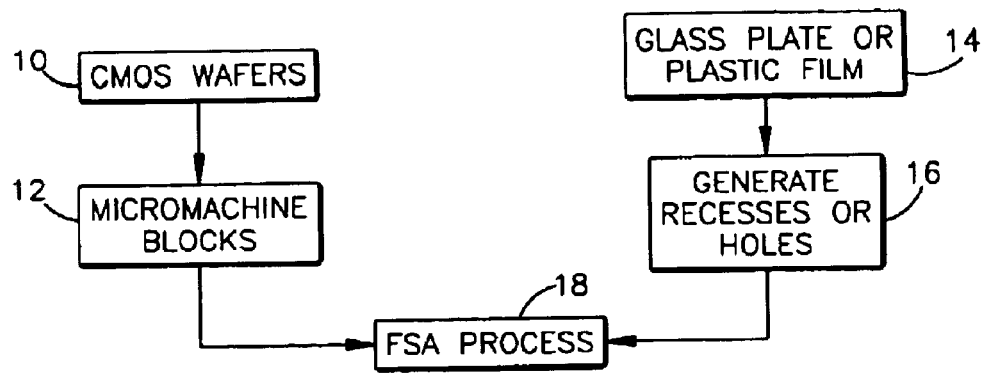
FIG. 1 is a block diagram that illustrates steps in the Fluidic Self Assembly process.
Figure 2:
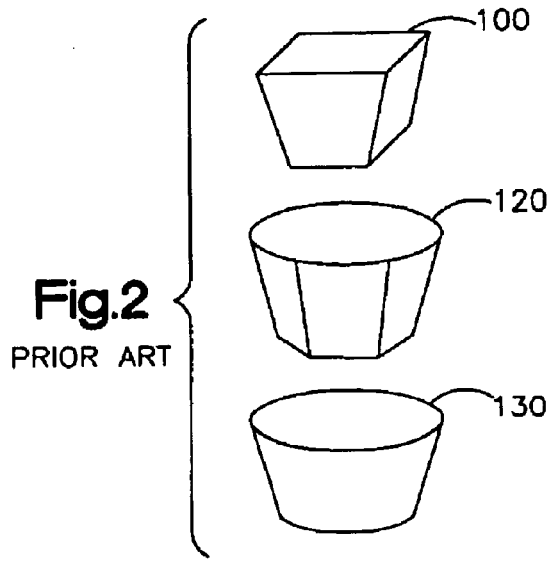
FIG. 2 illustrates three of the various possible shapes for small electronic blocks.
Figure 3:
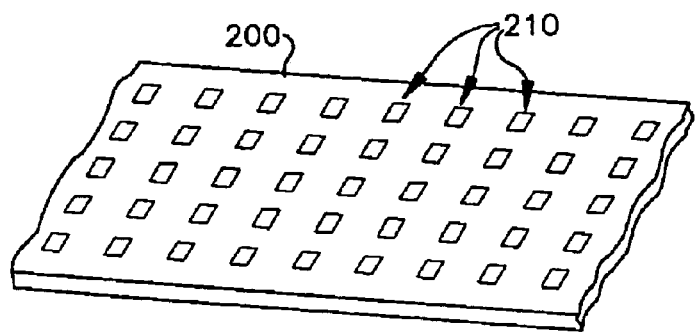
FIG. 3 illustrates a pattern of embossed wells on the surface of a portion of a web, into which small electronic blocks of complementary shape may be embedded.
Figure 4:
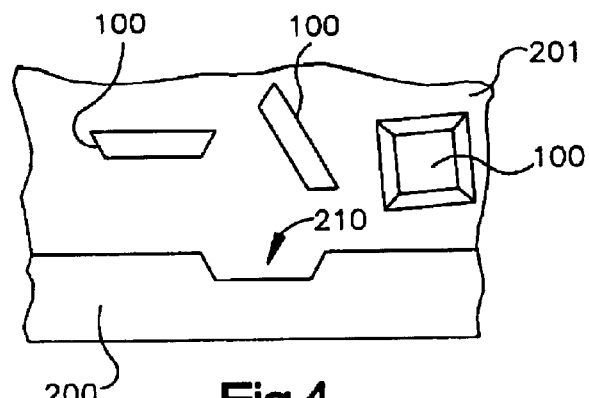
FIG. 4 illustrates a slurry atop an embossed substrate, in which small electronic blocks that are suspended in the slurry become lodged in respective wells.
Figure 5:
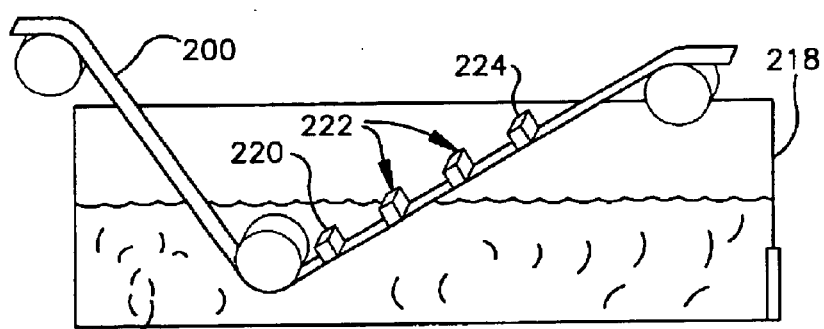
FIG. 5 illustrates a mechanism for moving an embossed substrate through a small electronic block slurry.
Figure 6:
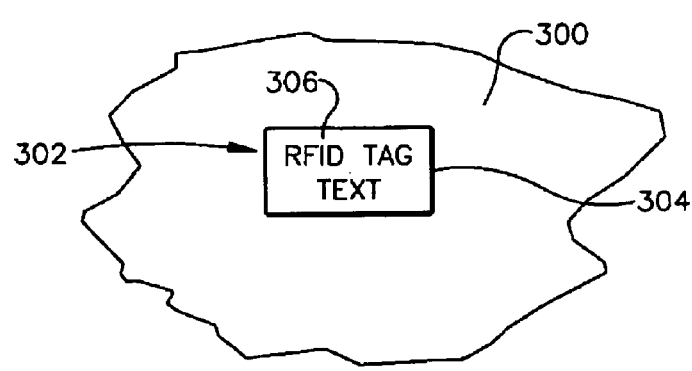
FIG. 6 illustrates an RFID label adhered to a substrate.

A device, such as a radio frequency identification (RFID) inlay structure for an RFID tag or label, includes a microstructure element, with leads coupling the microstructure element to other electrical or electronic components of the device. The leads may be electroless-plated leads, and may contact connectors of the microstructure element without the need for an intervening planarization layer.

Referring to FIGS. 7 and 8, a device 400 includes a microstructure element 402 in a microstructure element area 404. The device 400 shown in FIGS. 7 and 8 is an RFID inlay for use as part of an RFID tag or label. However, it will be appreciated that other types of devices may have a similar general structure.

The microstructure element 402 is coupled to one or more electrical or electronic components 408 of the device 400. One example of a component 408 is an antenna 410, such as that shown in FIG. 7. The antenna 410 has a pair of ends 412 that are coupled to the microstructure element 402 by leads 416. The microstructure element 402 is used to control the antenna 410.

The microstructure element 402 and the leads 416 may be part of a strap 420, a separate piece that is placed on a device substrate 424 of the device 402 after having been separately fabricated. The strap 420 has a strap substrate 426, in or on which the microstructure element 402 is placed, and on which the leads 416 are formed. The leads 416 may be plated on a strap substrate 426, for example being electroless-plated on the strap substrate 426.

Other alternative configurations for the microstructure element 402, the leads 416, and the other components 408 are discussed below. Further details of suitable methods for forming the device 400, as well as other devices, are also discussed below.

Some details of an example configuration for the microstructure element 402 are shown in FIG. 9. The microstructure element 402 has a semiconductor body 430, for example being made out of silicon. The semiconductor body 430 has beveled edges 432 and 434, cut for example at an angle of 54.7 degrees relative to a top surface 436 and a bottom surface 438 of the semiconductor body. The microstructure element 402 thus has trapezoidal-shaped cross-sections along its major axes, with the top surface 436 larger than the bottom surface 438. The microstructure element 402 has connectors 440 along the top surface 436, the contacts providing a means for electrical connection to buried electronic elements, such as a suitable combination of field effect transistors (FETs) and capacitors, within the semiconductor body 430. Thus the microstructure element 402 may include a simple microprocessor. The connectors 440 allow power, data, etc., to be input into and output out of the buried microprocessor.

It will be appreciated that the configuration of the microstructure element 402 shown in FIG. 9 is merely an example, and that the actual configuration of the microstructure element 402 used in the device 400 may be different, for example having a different number and/or configuration of connectors, and/or having a different body shape.

The microstructure element 402 may be functionally symmetric over a plurality of rotational orientations, thus enabling the microstructure element 402 to have a predetermined function independent of the orientation of the microstructure element when mounted in a correspondingly-shaped recess or well. For example, microstructure elements may have any of a variety of polygonal shapes having symmetry, such as a triangles, squares, rectangles, parallelograms, pentagons, or hexagons.

The microstructure element 402 may be small, for example, having a maximum width of about 1000 microns or less.

The microstructure element 402 may be deposited in a corresponding well or recess by a fluid self-assembly (FSA) process, such as that described above. In such a process a slurry containing the microstructure elements is flowed over the substrate, with the microstructure elements settling into the corresponding recesses in the substrate.

Figure 10:
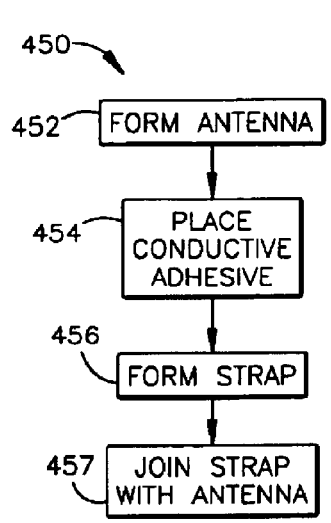
FIG. 10 is a high-level flow chart showing steps in the method of making the device of FIGS. 7 and 8.

A high-level flow chart of a method 450 of producing the device 400 is illustrated in FIG. 10. First, in step 452, the antenna 410 is formed on the device substrate 424. Then, in step 454, conductive adhesive is placed on the ends 412 of the antenna 410. In step 456, the strap 420 is formed. Finally, in step 457, the strap 420 is joined with the antenna 410 on the device substrate 424, with the leads 416 of the strap 420 in contact with the ends 412 of the antenna 410.

Each part of the method 450 is now described in greater detail. In step 452, the antenna 410 (FIG. 7) is formed. The antenna 410 may be formed by any of a variety of suitable methods, such as printing of conductive ink, plating, or other methods of selective metal deposition. A conductive adhesive is then deposited on the ends 412 of the antenna 410, such as by a suitable printing method, in step 454.

Figure 11:
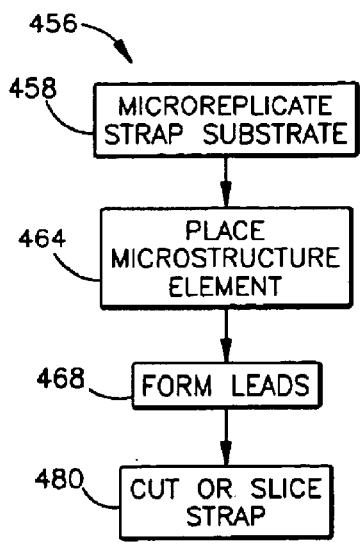
FIG. 11 is a flow chart showing more detail regarding the method of FIG. 10.
Figure 12:
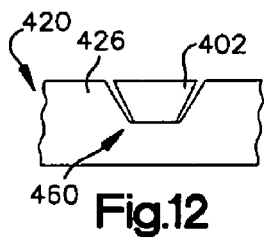
FIGS. 12 and 13 are side and plan views illustrating a step of the method of FIG. 11.
Figure 13:
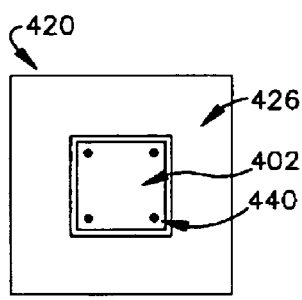

Referring now to FIGS. 11–13, the forming 456 of strap 420 begins in step 458 with microreplication of the strap substrate 426 to produce microstructure wells or recesses 460. As described further below, a sheet or roll of substrate material may be used to form a plurality of straps 420, each with one or more microstructure elements. The straps 420 may then be separated from the sheet and individually joined to respective device substrates.

There literally are thousands of thermoplastic materials available that may be considered as possible contenders for a substrate that could be formed to provide the necessary shaped receptor microstructure recesses. However, not all can be embossed on a continuous basis; nor can all meet the major general parameters discussed hereinabove or the specifications set forth hereinafter. In accordance with the instant invention, Avery Dennison has identified a relationship of parameters defining a rheological window which, when coupled with other specifications, facilitates the identification of materials that will meet the general specifications set forth herein.

Examples of suitable materials for the strap substrate 426 include polycarbonate, polyvinyl chloride, polystyrene, polymethyl methacrylate, polyurethane polyimide, polyester, cyclic polyolefin polymers, polyether sulfone (PES), polyethylene terephthalate (PET), polyethylene naphthalate, polycarbonate, polybutylene terephthalate, polyphenylene sulfide (PPS), polypropylene, polysulfone, aramid, polyamide-imide (PAI), polyimide, aromatic polyimides, polyetherimide, acrylonitrile butadiene styrene, and polyvinyl chloride. Further details regarding suitable substrates and substrate materials may be found in International Publication Nos. WO 00/46854, WO 00/49421, WO 00/49658, WO 00/55915, and WO 00/55916, the entire disclosures of which are herein incorporated by reference.

The substrate material may have characteristics that, after embossing and processing, retain a recess shape of ±10 $\mu$m for sizes of up to 1000 $\mu$m and for certain uses. For roll-to-roll manufacture, the total thickness may be less than 200 μm. The accuracy of each receptor site or recess may be 10 μm or less. In addition, the substrate may have significant chemical resistance to the FSA process, which may include exposure to Di water, non-ionic surfactants and bonding agents at about 30° C. for one hour. Further, the substrate material also must be inert to various industry recognized solvents, acids and bases used during processing. These exposures may run for periods from one minute to 30 minutes and at temperatures ranging from 30° to 100° C.

Figure 14:
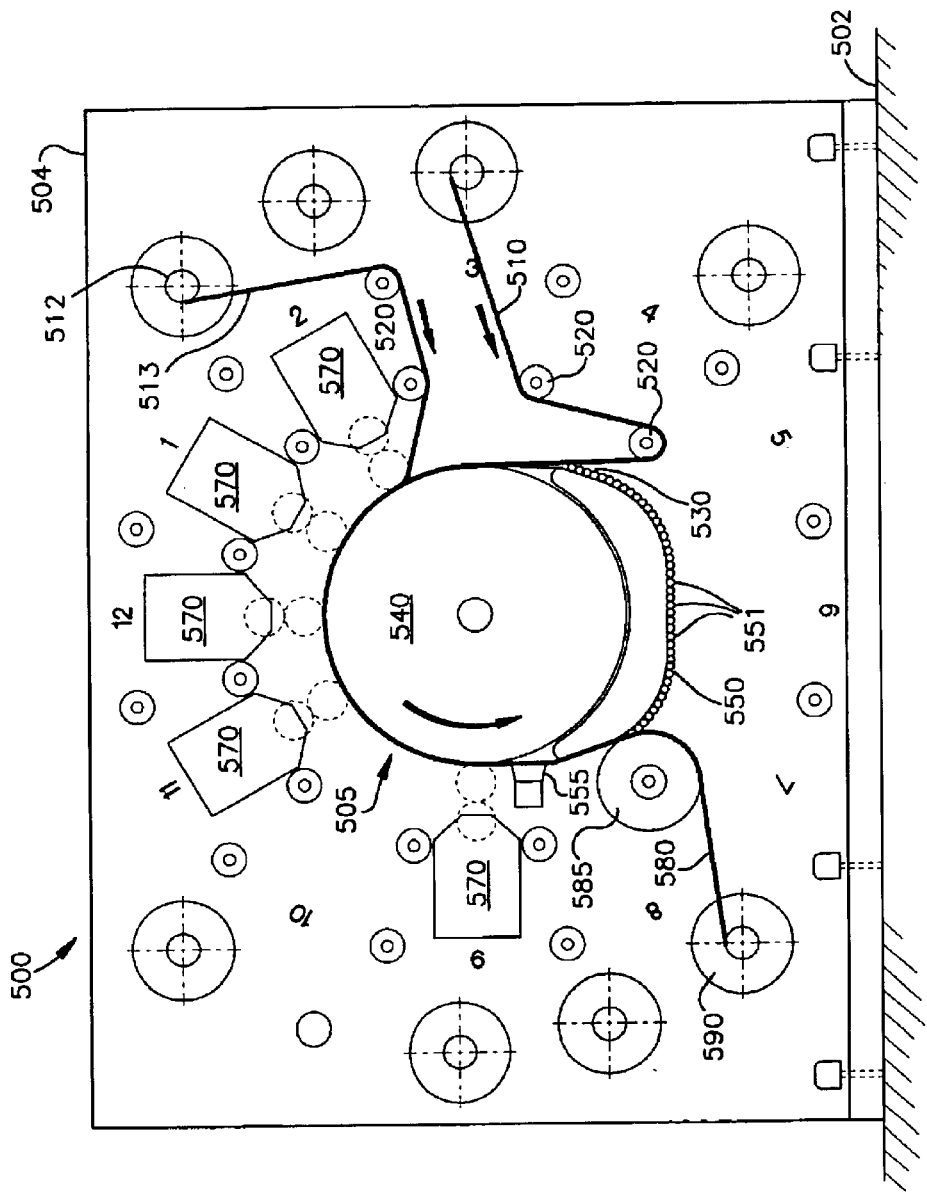
FIG. 14 is a diagrammatic end view of one type of embossing equipment which may be used to form the receptor recesses on the underlying substrate shown in FIGS. 12 and 13.

Considering equipment for producing embossed substrate in some detail, a preferred machine 500 for producing the embossed substrate 200 is shown in elevation in FIG. 14, suitably mounted on a floor 502. The machine 500 includes a frame 504, centrally mounted on which is an embossing means 505.

A supply reel 508 (FIG. 14) of unembossed thermoplastic web 510 is mounted on the right-hand side of the frame 504; so is a supply reel 512 of flexible plastic carrier film 515. The web 510 may be 0.005 inches (125 μm) thick and the film 515 may be about 0.002 inches (50 μm) thick. The flat web 510 and the film 515 are fed from reels 508 and 512, respectively, to the embossing means 505, and over guide rollers 520, in the direction of the arrows. For present purposes, the roll of film may be about 7 inches (19.05 cm) wide.

The embossing means 505 includes an embossing tool in the form of an endless metal belt 530 which may be about 0.020 inches in (0.5 mm) thickness, 36 inches (91.44 cm) in "circumference" and 10 inches (25.4 cm) wide. The width and circumference of the belt 530 will depend in part upon the width of the material to be embossed, the desired embossing speed, and the thickness of the belt 530. The belt 530 is mounted on and carried by a heating roller 540 and a shoe 550 having multiple rollers 551 with parallel axes. The roller 540 is driven by a chain (not shown) to advance the belt 530 at a predetermined linear speed in the direction of the arrow. The belt's outer surface has a continuous male embossing pattern 560 that matches the general size and shape of the particular blocks (100) for which the embossed recesses (210) are designed.

Evenly spaced sequentially around the belt, for about 180° around the heating roller 540, are a plurality, at least three, and as shown five, pressure rollers 570 of a resilient material, preferably silicone rubber, with a durometer hardness ranging from Shore A 20 to 90, but preferably, from Shore A 60 to 90. The rollers 570 are shown in dashed lines in two positions, engaged or retracted. The roller position and applied pressure may depend on the film material and its $T_g$.

In the machine 500 as constructed, the diameter of the heating roller 540 is about 35 inches (88.9 cm) and width is about 14 inches (35.6 cm). The diameter of each pressure roller 570 is about 5 inches (12.7 cm). The shoe 550 has 40 idler rollers 551 of stainless steel, each about ¾ inch (19 mm) in diameter. The shoe 550 and rollers 571 are arranged so that the belt 530 is raised off of the heating roller 540 as it rotates, and then returns to the roller. Removing the belt enables it to cool quickly, and cooling is facilitated by a cooling knife or blade 555 positioned just prior to the shoe 550. The shoe also may be hollow and a chilled fluid may flow through it.

Depending on the material selected, it may be desirable to maintain additional pressure about the tool and substrate during cooling, in which case the laminate will be directed to leave the shoe at a later point. As will be desired, the frame 504 permits a variety of positions for the various rolls.

The heating roller 540 may have axial inlet and outlet passages (not shown) joined by an internal spiral tube (not shown) for the circulation therethrough of hot oil (in the case of the heating roller 540) or other material (in the case of the shoe 550) supplied through appropriate lines (not shown). The embossing equipment 500 is an improvement over that disclosed in aforesaid U.S. Pat. Nos. 4,486,363 and 4,601,861. The equipment may employ the improvements disclosed and claimed in U.S. application Ser. No. 09/231,197, entitled "Method and Apparatus for Embossing a Precision Pattern of Micro-Prismatic Elements in a Resinous Sheet or Laminate," commonly assigned, the disclosure of which is incorporated herein by reference, filed Jan. 14, 1999.

The web 510 and the film 515, as stated, are fed to the embossing means 540, where they are superimposed to form a laminate 580 which is introduced between the belt 530 and the leading pressure roller 570, with the web 510 positioned between the film 515 and the belt 530. From there, the laminate 580 is moved with the belt 530 to pass under the remaining pressure rollers 570 and around the heating roller 540 and from there along the belt 530 around a portion of the shoe 550. Thus, one face of the web 510 directly confronts and engages the embossing pattern 560 and one face of the film 515 directly confronts and engages the pressure rollers 570.

The film 515 provides several functions during this operation. First, it serves to keep the web 510 pressed against the belt 530 while they travel around the heating and cooling rollers 540 and shoe 550 and traverse the distance between them. This assures conformity of the web 510 with the precision pattern 500 of the tool as the web (now embossed substrate) drops below the glass transition temperature of the material. Second, the film 515 provides on the lower unembossed surface of the substrate, a flat and highly finished surface suitable for other processing, if desired. Finally, the film 515 acts as a carrier for the web 510 in its weak "molten" state and prevents the web from adhering to the pressure rollers 570 as the web is heated above the glass transition temperature. A number of possible candidates exist for the carrier film, including polyester Mylar; PEN; poly ether ether-ketone; thermoplastic polyimide (Imidex); polyimide (Kapton); and others suggested in the aforesaid copending application Ser. No. 09/489,789.

The embossing means 505 includes a stripper roller 585, around which the laminate 580 is passed, to remove the same from the belt 530 shortly after the belt 530 itself leaves the heating roller 540 on its return path to the shoe 550.

The laminate 580 is then fed from the stripper roller 585 where it is wound onto a storage winder 590 mounted on frame 504 at the left-hand end thereof and near the bottom thereof.

The heating roller 540 is internally heated (as aforesaid) so that as the belt 530 passes thereover through the heating station, the temperature of the embossing pattern 560 at that portion of the tool is raised sufficiently to heat the web 510 to a temperature above its glass transition temperature, and to its embossing temperature $T_e$, but not so high as to exceed the melting temperature of the carrier film 515. For the web formed from the different materials forming the substrates herein and the film 515, a suitable embossing temperature $T_e$ for the heating roller 540 in the heating station is believed to require a $T_e$ at least about 100° C. greater than $T_g$ of the polymer. The carrier film 515 may be stripped from the film before or after windup, depending upon other post-embossing processes.

As the belt 530 and substrate pass the cooling knife 555, the temperature of the embossing pattern 560 at that portion of the tool is lowered sufficiently to cool the web 510 to a temperature close to or below its glass transition temperature so that the web becomes sufficiently solid and formed prior to the time laminate 580 is stripped from the tool 530.

It has been found that the laminate 580 can be processed through the embossing means 505 at the rate of about 20 inches (0.5 meter) per minute, with satisfactory results in terms of the accuracy, dimensional stability, and other pertinent properties of the finished substrate. For purposes of the present invention, rolls of embossed film of 200 feet may be provided, and if desired in later processing, butt spliced to like rolls. For smart card processing, ideally the film will be about 6.22" (158 mm) wide.

It should be noted that reference numeral 510 may refer indiscriminately herein to the embossed substrate 200 or web 510 in its initial form, to its in-process form, or to its final embossed form, as appropriate. Also, as will be described hereinafter, the web itself may comprise several layers of material fed into the embossing equipment.

The term "glass transition temperature" is a well known term of art and is applied to thermoplastic materials as well as glass. The term "glass transition temperature $T_g$," is an important transition temperature applied generally to polymers. It is the temperature at which the polymer or material changes from the glassy state to the rubbery state. In general, the temperature has to be further increased in excess of $T_g$ for the polymer to go from the rubbery to the flow state. For example, for Polysulfone, the $T_g$ begins at about 190° C., changing into the rubbery state at about 210° C., and begins to flow at 230° C. ($T_e \geq 230°$ C.). For the various extendable types of materials identified as suitable for the substrate 200 herein, the glass transition temperatures $T_g$ range from about 325° F. to 410° F. (163° C. to 215° C.).

It will be further understood that the temperatures of the heating roller and cooling shoe may need to be adjusted within certain ranges depending upon the web material selected. Certain materials have a higher $T_g$, and others may require cooling at a higher temperature than normal and for a longer time period. Preheating or additional heating at the entrance of the nips may be accomplished by a laser, by a flameless burner, by an infrared lamp, or another device, and by adjusting the temperature of the heating roller to run at a higher preselected temperature. Similar adjustments may be made at the cooling level.

A preferred material for the embossing tool 530 disclosed herein is nickel. The very thin tool (about 0.010 inches (0.254 mm) to about 0.030 inches (0.768 mm)) permits the rapid heating and cooling of the tool 530 and the web 510 through the required temperature gradients while pressure is applied by the pressure rolls and the carrier film. The result is the continuous production of a precision pattern that maintains flatness and angular accuracy while permitting the formation of sharp corners with minimal distortion of other surfaces, whereby the finished substrate provides an array of recesses 210 formed with high accuracy.

Another form of embossing equipment is a continuous press machine. Such a machine is disclosed in co-pending U.S. application Ser. No. 09/596,240, filed Jun. 16, 2000, entitled "A Process for Precise Embossing", and commonly assigned, incorporated herein by reference. Such continuous presses include double band presses which have continuous flat beds with two endless bands or belts, usually steel, running above and below the product and around pairs of upper and lower drums or rollers. These form a pressure or reaction zone between the two belts and advantageously apply pressure to a product when it is flat rather than when it is in a curved form. The double band press also allows pressure and temperature to vary over a wide range. Dwell time or time under pressure is easily controlled by varying the production speed or rate, and capacity may be changed by varying the speed, length, and/or width of the press.

Further details regarding suitable micro-embossing processes are disclosed in U.S. Pat. Nos. 4,478,769; 4,601,861; and 4,633,567; the entire disclosures of which are incorporated by reference.

Referring back to FIGS. 11–13, in step 464 an FSA process is used to place the microstructure element 402 in the microstructure recess 460. The FSA process may be similar to that described above.

Figure 15:
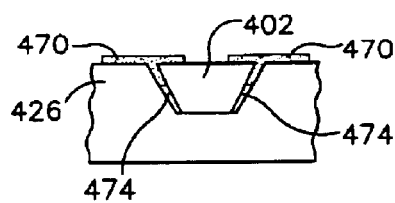
FIGS. 15 and 16 are side and plan views illustrating another step of the method of FIG. 11.
Figure 16:
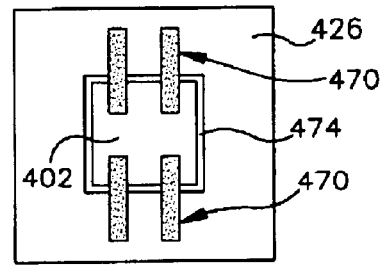

Referring now in addition to FIGS. 15 and 16, in step 468 formation of the leads 416 begins by printing of a catalyst layer 470 on the strap substrate 426. The catalyst layer 470 is selectively printed onto the areas of the strap substrate 426 where the leads 416 are to be formed. As seen best in FIG. 15, the catalyst layer 470 partially fills gaps 474 between the microstructure element 402 and side walls of the microstructure recess 460. The catalyst layer may have a thickness from about 100 nanometers to about 5 microns, although it will be appreciated that other suitable thicknesses for the catalyst layer 470 may be employed, for example depending on the printing method and catalysis material.

Any of a variety of suitable materials may be used for the catalyst layer 470. Examples of suitable materials may include PVC powder, palladium dichloride bisacetonitrile, LiCl in THF solution, $PdCl_2$, and $Pd(NO_3)_2$. Further suitable catalyst materials may be found in U.S. Pat. Nos. 4,900,618, 4,910,072, 5,075,037, 5,087,510, and 5,227,223, all of which are herein incorporated by reference in their entireties.

The printing of the catalyst layer 470 may be by any of a variety of suitable printing techniques, such as screen printing, ink jet printing, flexo printing, or gravure printing. Alternatively, it will be appreciated that other suitable techniques may be utilized to apply the catalyst layer 470 to the strap substrate 426.

Following printing of the catalyst layer 470, the catalyst layer may be activated. Such activation may be performed, for example, by heating. Such heating may be accomplished by raising the temperature of the environment in which the process is performed, by UV heating, by IR heating, or by laser heating. It will be appreciated that it may be possible to use a catalyst that does not require activation. Further details regarding activation processes may be found in the previously-incorporated U.S. Pat. Nos. 4,900,618, 4,910, 072, 5,075,037, 5,087,510, and 5,227,223.

Figure 16A:
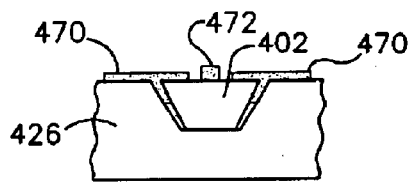
FIGS. 16A and 16B are side and plan views illustrating still another step of the method of FIG. 11.
Figure 16B:
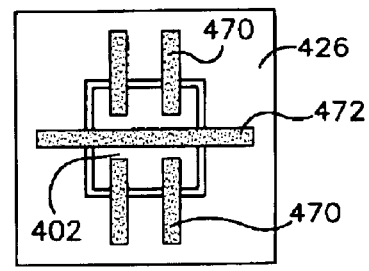

Referring now in addition to FIGS. 16A and 16B, a strip or band 472 may be formed on the strap substrate 426, overlying the microstructure element 402. The strip 472 functions to retain the microstructure element 402 within the recess 460. The strip 472 may be any of a variety of materials, such as a suitable resin or epoxy. The strip 472 may be printed on the substrate 426 in a suitable location, using a suitable printing method, and may be suitably cured or hardened, for example by heating or by exposure to UV, IR or laser radiation. It will be appreciated that the strip 472 may be formed before or after the printing of the catalyst layer 470. In addition, it will be appreciated that the catalyst layer 470 may be hardened, and the strip 472 may be hardened, in a single operation, if suitable.

Figure 17:
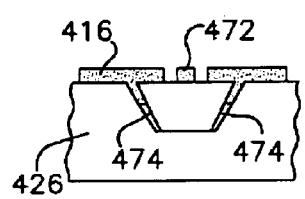
FIGS. 17 and 18 are side and plan views illustrating yet another step of the method of FIG. 11.
Figure 18:
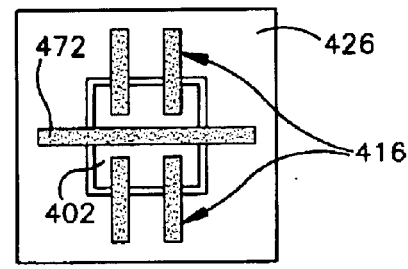

Turning now in addition to FIGS. 17 and 18, in step 468 (FIG. 11), electroless plating is used to form the leads 416. The electroless plating process may include immersing the strap sheet in a plating solution that includes the material to be plated. The plating material adheres to the catalyst layer 470, but generally does not otherwise adhere to the strap sheet. More precisely, the catalyst layer 470 may cause metal ions in the plating solution to form the metal leads 416 on the strap substrate 426. The presence of the catalyst layer 470 in the gaps 474 may prevent conductive plating material from entering into the gaps 474. It will be appreciated that it is desirable to keep conductive material out of the gaps 474, in order to avoid potential short-circuiting of the microstructure element 402. It will be appreciated that other means may be undertaken to prevent the conductive material from entering the gaps 474, for example inserting a suitable sealant or other filler material into the gaps 474.

The immersion in the plating solution may be accomplished by dipping the strap sheet in a tank of plating solution. Such dipping may be part of a roll-to-roll process.

An example of a suitable plating solution material for accomplishing the electroless plating is a mixture that includes copper sulfate, potassium sodium tartrate, formalin, sodium hydroxide, and an EDTA aqueous solution. It will be appreciated that a large variety of suitable plating solutions are available and known in the art. Further details regarding plating solutions may be found in the previously-incorporated U.S. Pat. Nos. 4,900,618, 4,910,072, 5,075,037, 5,087,510, and 5,227,223.

The leads 416 formed in the process described above may be copper leads having a thickness of about 5 $\mu$m or less. It will be appreciated that other suitable methods may be utilized to form the leads 416.

In step 480 (FIG. 11), the individual straps 420 are separated from the sheet of straps, by any of a variety of suitable methods, such as cutting or slicing.

Following separation of the strap 420, in step 457 (FIG. 10), the strap 420 is placed on the device substrate 424. The placement may be accomplished in a suitable pick-and-place operation, by use of a suitable pick-and-place device. Suitable registration of the strap 420 and the device substrate 424 may be utilized to facilitate placement of the strap 420 in a desired location on the device substrate 424. The straps may be secured with any of a variety of suitable adhesives, which may be applied to the strap 420 and/or the device substrate 424 prior to joining them together. It will be appreciated that a wide variety of suitable pick-and-place devices are well known. Examples of such devices are the devices disclosed in U.S. Pat. Nos. 6,145,901, and 5,564,888, both of which are incorporated herein by reference, as well as the prior art devices that are discussed in those patents. Alternatively, rotary placers may be utilized to place the strap 420 upon the device substrate 424. An example of such a device is disclosed in U.S. Pat. No. 5,153,983, the disclosure of which is incorporated herein by reference.

The strap 420 is joined with the antenna 410 on the device substrate 424. The strap 420 may be placed in a "flip chip" facedown configuration, such that the leads 416 of the strap 420 contact the ends 412 of the antenna, and the strap substrate 426 is not in contact with the device substrate 424. The leads 416 are secured to the ends 412 by the conductive adhesive previously place on the ends 412.

Many of the processes described above may be performed as roll-to-roll process, being performed on a roll of substrate material. For example, the formation of the microstructure recesses, the FSA, the electroless plating operations to form the leads 416, the placement of the straps 420 on the device substrate 424, and the formation of the antenna 410, all may be in whole or in part performed as roll-to-roll processes. Alternatively, some or all of these processes may be performed as batch processes.

The device substrate 424 may be any of a variety of suitable materials. A wide variety of suitable flexible thermoplastics may be utilized for roll-to-roll processes. In addition, it will be appreciated that a wide variety of rigid materials may be utilized if roll-to-roll processing is not used.

It will be appreciated that the device and method described above dispense with the need for a planarization layer. The planarization layer has been used to prevent conductive ink, used for forming leads, from contacting sides of the microstructure elements, which may lead to shorting out of the microstructure elements. Using a planarization layer results in additional steps, including deposition of the planarization layer itself, and creation of vias in the planarization layer to allow access to the connectors of the microstructure element. It will be appreciated that dispensing with the need for a planarization layer simplifies the manufacturing process, which may result in savings of materials, cost, and/or time.

The device 400 has been described above as utilizing the single microstructure element 402 to control the antenna 410. However, it will be appreciated that many alternative configurations may be utilized, including multiple microstructure elements and/or components other than antennas. For example, the other components may include components of a display device, such as a liquid crystal display, and the microstructure element 402 may be part of the control of the display.

The device 400 described above may be an RFID inlay that is part of an RFID tag or label.

Figure 18A:
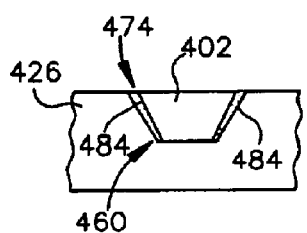
FIGS. 18A and 18B are side and plan views illustrating an alternative step that may be incorporated in the method of FIG. 11.
Figure 18B:
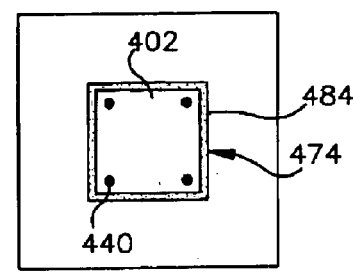

It will be appreciated that alternative methods may be used to make devices such as the device 400. For example, referring to FIGS. 18A and 18B, a dielectric material 484 may be used to fill the gaps 474 between the sidewalls of the recess 440 and the microstructure element 402. The dielectric material may be any of a variety of suitable low viscosity thermal cure dielectric materials. The dielectric material may be deposited as a liquid and suitably cured. The method of making the device may then continue with printing of the catalyst layer 470 (FIGS. 15 and 16), and with the remainder of the method described above. Filling the gaps 474 with a separate dielectric material may provide increased protection against conductive material entering into the gaps, and/or may allow use of different types of catalyst materials.

Turning now to FIGS. 19 and 20, an alternate embodiment device 500 is shown. In the device 500, the need for formation of a separate strap 420 is avoided by having the microstructure element 402 placed in a suitable microstructure recess 510 in a suitable device substrate 424. The antenna 410 and the leads 416 may be unitarily plated in a single step, as a single structure.

The device substrate 424 may include suitable of the materials described above for use in the strap substrate 426. The formation of the microstructure recess 510 and the placement of the microstructure element 402 in the microstructure recess 510 may be similar to the corresponding processes in the formation of the strap 420 (FIG. 12). The plating of the antenna 410 and the leads 416 may utilize similar materials and processes to those described above with regard to the formation of the leads 416 of the strap 420.

Figure 21:
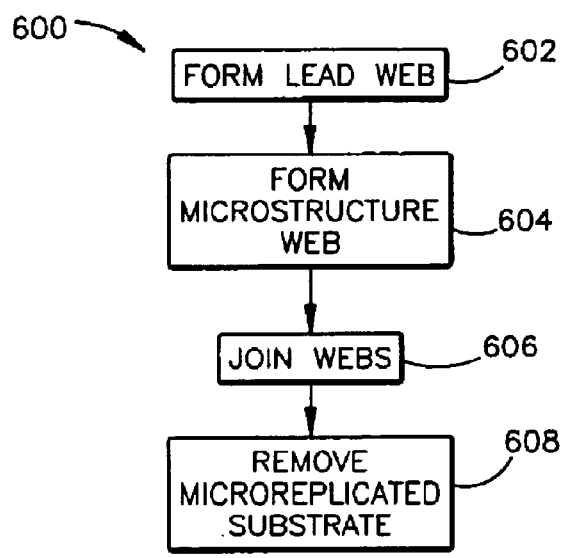
FIG. 21 is a high-level flow chart showing another method for making a device, in accordance with the present invention.

FIG. 21 shows a high-level flowchart of another embodiment process of the invention, a method 600 for forming a device with the leads 416 and the microstructure element 402 initially on separate webs, which are then joined together.

In step 602, the lead web is formed. The microstructure web is formed in step 604. Thereafter, in step 606, the webs are joined together, with connectors on the microstructure element being coupled to corresponding leads on the lead web. Finally, in step 608, the microreplicated substrate of the microstructure web may be removed, and may be re-used.

Figure 22:
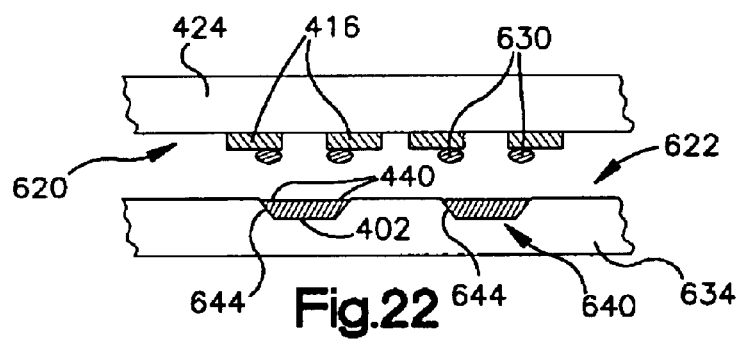
FIGS. 22, 23, and 24 are side views of a device, illustrating steps of one embodiment of the method of FIG. 21.
Figure 23:
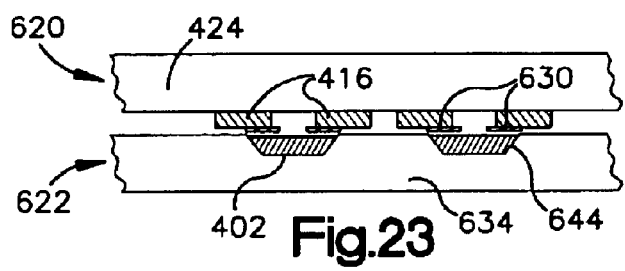
Figure 24:
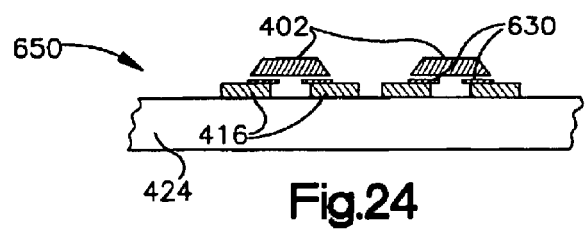

Referring to FIGS. 22–24, steps of an embodiment of the method 600 are illustrated. The separate lead web 620 and microstructure web 622 are shown in FIG. 22. The lead web 620 includes a device substrate 424 with the leads 416 and other structures (such as an antenna) thereupon. The leads 416 may be formed in conjunction with formation of the antenna 410 (FIGS. 7 and 19) or other components coupled to the leads 416. Conductive adhesive balls 630 may be deposited on the leads 416 at suitable positions for interface with connectors 440 of the microstructure elements 402 on the microstructure web 622.

The leads 416 may be formed on the device substrate 424 using electroless plating, as described above. Alternatively, the leads 416 and the antenna 410 may be formed using other suitable processes, such as printing of a conductive ink, such as an ink containing silver particles; electrolytic plating of the leads 416 and/or the antenna 410; or depositing of metal, as by sputtering, and selectively removing metal, as by etching.

The microstructure web 622 includes a microreplicated substrate 634 with microstructure recesses 640 therein. The microstructure recesses 640 in the microreplicated substrate 634 may be by a suitable roll-to-roll process, such as that described above. The microstructure elements 402 may be inserted into the recesses through a suitable FSA process, again as has been described above.

The microstructure web 622 may include a release layer 644, which may facilitate releasing the microreplicated substrate 634 from the microstructure elements 402 after the webs 620 and 622 have been joined together. The release layer 644 may include a releasable adhesive, which for example may be de-activated by heating or exposure to UV radiation. The release layer may include a suitable release agent, such as a suitable silicon release agent.

Turning now to FIG. 23, the webs 620 and 622 may be laminated together, for example in a suitable roll process. The conductive adhesive 630 may then be suitably cured, for example by being heated or by exposure to radiation of a suitable wavelength, such as suitable UV radiation.

FIG. 24 shows the resulting device 650 after removal of the microreplicated substrate 634. As suggested above, the release layer 644 may be de-activated, having its adhesiveness reduced, prior to pulling the microreplicated substrate 634 off.

It will be appreciated that the "flip-chip" layout shown in FIG. 24 may advantageously have a smaller-area surface of a microstructure element 402 farther from the device substrate 424 than a larger-area surface of the microstructure element 402. Thus the placement of a trapezoidal-cross-section microstructure element 402 in "face-down" position may tend to minimize potential damage to the microstructure element in further processing.

Figure 25:
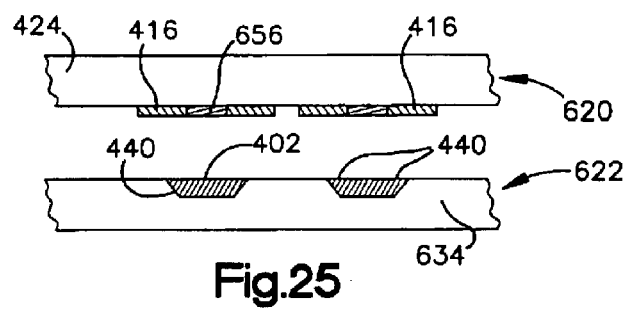
FIGS. 25, 26, 27, and 28 are side views of a device, illustrating steps of another embodiment of the method of FIG. 21.

FIGS. 25–28 show steps of another embodiment of the method 600. FIG. 25 illustrates the webs 620 and 622. The webs 620 and 622 are identical to their counterparts shown in FIG. 25, with the exception that the lead web 620 includes a pressure-sensitive adhesive (PSA) 656 instead of the conductive adhesive 630 shown in FIGS. 22–24. The PSA 656 may include any of a variety of suitable pressure sensitive adhesives.

Figure 26:
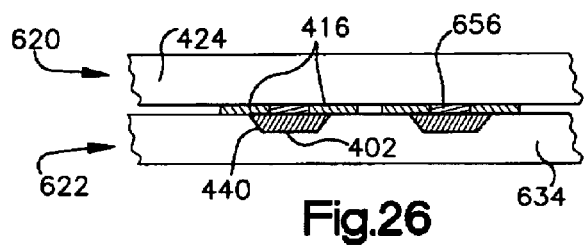

FIG. 26 illustrates the joining of the webs 620 and 622. The webs 620 and 622 may be pressed together, such as by lamination in a suitable roll process. The PSA 656 may then be activated, such as by heating or by other exposure to radiation, securing the connection points 440 (FIG. 25) of the microstructure elements 402 in contact with the leads 416.

Figure 27:
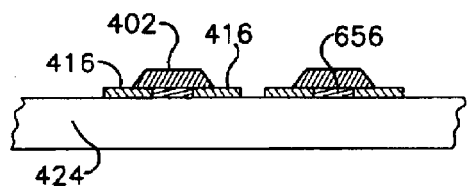
Figure 28:
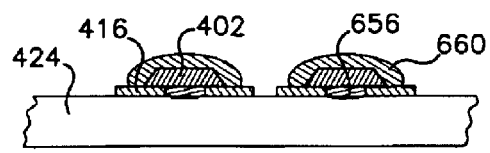

Further steps in the method, illustrated in FIGS. 27 and 28, include removing the microreplicated substrate 424, and placing a heat shrink material 660 on the microstructure elements 402. The heat shrink material 660 may then be heated to shrink it, bringing the microstructure elements 402 in closer and more secure contact with the leads 416. Examples of suitable heat shrink materials include Polymark M331, available from Polymark, Inc., and AMICON 50300 HT, AMICON 50300 LT, AMICON 50300 LV, AMICON 50300-1, and AMICON 50400-1, available from Emerson & Cuming of Canton, Mass.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for producing an electronic device, comprising:
    forming leads directly in contact with a substrate; and
    coupling the leads to connectors of a microstructure element;
    wherein the forming and the coupling are parts of a direct metallizing of the leads in contact with the connectors;
    wherein the direct metallizing includes electroless plating of the leads; and
    wherein the electroless plating includes:
        depositing a catalyst on the substrate;
        activating the catalyst; and
    bringing the catalyst into contact with a plating solution, to thereby form the leads.

2. The method of claim 1, wherein the depositing the catalyst includes printing the catalyst.

3. The method of claim 2, wherein the printing includes screen printing the catalyst.

4. The method of claim 2, wherein the printing includes ink jet printing the catalyst.

5. The method of claim 2, wherein the printing includes flexo printing.

6. The method of claim 1, further comprising placing the microstructure element in the recess in the substrate.

7. The method of claim 6, wherein the placing includes passing a slurry containing the microstructure element over the substrate.

8. The method of claim 1, further comprising operatively coupling the leads with another component of the device.

9. The method of claim 8,
wherein the substrate is a strap substrate;
wherein the strap substrate, the microstructure element, and the leads are all part of a strap; and
wherein the operatively coupling includes placing the strap in contact with the another component.

10. The method of claim 9, wherein the placing includes placing the strap using a pick-and-place device.

11. The method of claim 8, wherein the operatively coupling includes adhesively coupling the leads and the another component using a conductive adhesive.

12. The method of claim 8, wherein the operatively coupling includes mechanically coupling the leads and the another component.

13. The method of claim 8, wherein the another component is an antenna.

14. The method of claim 13, wherein the antenna and the leads are separately formed.

15. The method of claim 14, wherein the operatively coupling includes coupling the antenna and the leads using a conductive adhesive.

16. The method of claim 14, wherein the operatively coupling includes mechanically coupling the antenna and the leads.

17. The method of claim 8, further comprising forming the antenna.

18. The method of claim 1, wherein substantially all of the process is performed as one or more roll-to-roll operations.

19. The method of claim 1, wherein the forming the leads includes forming the leads without a planarization layer intervening between any part of the substrate and any part of the leads.

20. The device formed by the method of claim 1.

21. The device of claim 20, wherein the leads are plated onto the connectors of the microstructure element.

22. The device of claim 20, wherein the leads are mechanically coupled to the connectors by being in contact with the connectors.

23. The device of claim 20, wherein the leads include copper.

24. The device of claim 20, wherein the leads are also operatively coupled to an antenna.

25. The device of claim 24, wherein the leads and the antenna are a single unitary material.

26. The device of claim 24, wherein the device is part of an RFID tag.

27. The device of claim 24, wherein the device is part of an RFID label.

28. The device of claim 20, wherein the microstructure element is in a recess in the substrate.

29. The device of claim 28, further including a catalyst at least partially filling a gap between the microstructure element and sidewalls of the recess.

30. The device of claim 20, wherein the microstructure element is outside of the substrate, and wherein the connectors of the microstructure element face the substrate.

31. The device of claim 30,
wherein the microstructure element has first and second surfaces on opposite sides thereof;
wherein the first surface has the connectors thereupon;
wherein the first surface is closer to the substrate than the second surface; and
wherein the first surface has a greater area than the second surface.

32. The device of claim 31, wherein the microstructure element has a trapezoidal cross-sectional shape.

33. A method for producing an electronic device, comprising:
forming leads directly in contact with a substrate; and
coupling the leads to connectors of a microstructure element;
wherein the forming and the coupling are parts of a direct metallizing of the leads in contact with the connectors;
wherein a gap exists between the microstructure element and side walls of the recess;
wherein the forming includes forming the leads over the gap;
wherein the direct metallizing includes electroless plating of the leads;
wherein the electroless plating includes:
depositing a catalyst on the substrate;
activating the catalyst; and
bringing the catalyst into contact with a plating solution, to thereby form the leads; and
wherein the depositing includes depositing the catalyst at least partially into the gap.

34. The method of claim 33, wherein at least part of the catalyst remains in the gap after the forming of the leads is completed.

35. The method of claim 33, wherein the recess in which the microstructure element is located, is in the substrate.

36. A method for producing an electronic device, comprising:
forming leads directly in contact with a substrate; and
coupling the leads to connectors of a microstructure element;
wherein the forming and the coupling are parts of a direct metallizing of the leads in contact with the connectors;
wherein a gap exists between the microstructure element and side walls of the recess;
wherein the forming includes forming the leads over the gap;
wherein the direct metallizing includes electroless plating of the leads; and
wherein the electroless plating includes:
depositing a catalyst on the substrate;
activating the catalyst; and
bringing the catalyst into contact with a plating solution, to thereby form the leads; and
further comprising, prior to the depositing the catalyst, depositing a dielectric material into the gap.

37. The method of claim 36, further comprising curing the dielectric material in the gap.

38. A method for producing an electronic device, comprising:
forming leads directly in contact with a substrate;
coupling the leads to connectors of a microstructure element; and
forming a strip across the microstructure element to retain the microstructure element in the recess
wherein the forming the leads and the coupling are parts of a direct metallizing of the leads in contact with the connectors;
wherein a gap exists between the microstructure element and side walls of the recess;
wherein the forming the leads includes forming the leads over the gap;

wherein the direct metallizing includes electroless plating of the leads; and wherein the electroless plating includes:
depositing a catalyst on the substrate;
activating the catalyst; and
bringing the catalyst into contact with a plating solution, to thereby form the leads.

39. The method of claim 38, wherein the forming the strip occurs prior to the bringing the catalyst into contact with the plating solution.

40. The method of claim 39, wherein the forming the strip occurs after the activating the catalyst.

41. A method for producing an electronic device, comprising:

forming leads directly in contact with a strap substrate;

coupling the leads to connectors of a microstructure element; and operatively coupling the leads with an antenna of the device;

wherein the strap substrate, the microstructure element, and the leads are all part of a strap;

wherein the operatively coupling includes placing the strap in contact with the antenna;

wherein the forming and the coupling are parts of a direct metallizing of the leads in contact with the connectors; and wherein the antenna and the leads are formed as a unitary single structure on the substrate, by direct metallization.

42. A method for producing an electronic device, comprising:

forming leads directly in contact with a substrate, wherein the substrate is a lead substrate; and wherein the lead substrate and the leads are part of a lead web;

coupling the leads to connectors of a microstructure element; wherein the microstructure element is part of a microstructure web that includes a microreplicated substrate into which the microstructure element is placed; and following the coupling, separating the microstructure element from the microstructure web.

43. The method of claim 42, wherein the coupling further includes adhesively coupling the leads and the connectors using a conductive adhesive.

44. The method of claim 43, wherein the adhesively coupling includes curing the conductive adhesive.

45. The method of claim 42, wherein the coupling further includes securing the microstructure element to the leads using an adhesive.

46. The method of claim 45, wherein the adhesive is a pressure sensitive adhesive.

47. The method of claim 42, further comprising, prior to the coupling, placing the microstructure element in a recess in the microreplicated substrate.

48. The method of claim 47, wherein the placing includes passing a slurry containing the microstructure element over the microreplicated substrate.

49. The method of claim 42, wherein the forming the leads includes plating the leads.

50. The method of claim 49, wherein the plating includes electroless plating.

51. The method of claim 49, wherein the plating includes electrolytic plating.

52. The method of claim 49, wherein the forming includes printing a conductive ink to form the leads.

53. The method of claim 49, wherein the forming includes depositing a metal layer, and selectively etching the metal layer to form the leads.

54. The device formed by the method of claim 42, wherein the leads are adhesively coupled to the connectors by a conductive adhesive.

55. The method of claim 42, wherein the coupling includes laminating the webs together.

56. The method of claim 42, wherein substantially all of the process is performed as one or more roll-to-roll operations.

57. The method of claim 42, wherein the forming the leads includes forming the leads without a planarization layer intervening between any part of the substrate and any part of the leads.

58. A method for producing an electronic device, comprising:

forming leads directly in contact with a lead substrate; and coupling the leads to connectors of a microstructure element;

prior to the coupling, placing the microstructure element in a recess in the microreplicated substrate; and prior to the placing, coating the recess with a release layer;

wherein the lead substrate and the leads are part of a lead web;

wherein the microstructure element is part of a microstructure web that includes a microreplicated substrate into which the microstructure element is placed; and wherein the coupling includes laminating the webs together.

59. The method of claim 58, wherein the release layer includes a releasable adhesive.

60. The method of claim 59, wherein the releasable adhesive is characterized in that its adhesiveness is reduced by heating.

61. A method for producing an electronic device, comprising:

forming leads directly in contact with a lead substrate;

coupling the leads to connectors of a microstructure element, wherein the microstructure element is part of a microstructure web that includes a microreplicated substrate into which the microstructure element is placed; and following the coupling, separating the microreplicated substrate from the microstructure element;

wherein the lead substrate and the leads are part of a lead web;

wherein the coupling includes laminating the webs together; and wherein the coupling includes securing the microstructure element to the leads.

62. The method of claim 61, wherein the microreplicated substrate is a re-usable microreplicated substrate.

63. The method of claim 61, wherein the separating includes de-activating a release layer between the microstructure element and the recess.

64. The method of claim 63, wherein the release layer includes a releasable adhesive characterized in that its adhesiveness is reduced by heating, and wherein the de-activating includes heating the releasable adhesive.

65. The method of claim 61, further comprising, following the separating, placing a heat shrink material on the microstructure element and the leads.

66. The method of claim 65, further comprising heating the heat shrink material, thereby securing the connection between the leads and the connectors of the microstructure element.

67. A method for producing an electronic device, comprising:
  forming leads directly in contact with a substrate;
  coupling the leads to connectors of a microstructure element that is in a recess in the substrate; and
  forming a strip across the microstructure element to retain the microstructure element in the recess;
  wherein the leads are directly deposited on the substrate;
  wherein the forming and the coupling are parts of a direct metallizing of the leads in contact with the connectors; and
  wherein the direct metallizing includes electroless plating of the leads.

68. A method for producing an electronic device, comprising:
  placing a microstructure element in a recess in a substrate;
  forming leads directly in contact with the substrate;
  coupling the leads to connectors of the microstructure element; and
  forming a strip across the microstructure element to retain the microstructure element in the recess;
  wherein the forming and the coupling are parts of a direct metallizing of the leads in contact with the connectors;
  wherein the direct metallizing includes electroless plating of the leads;
  wherein a gap exists between the microstructure element and side walls of the recess; and
  wherein the forming includes forming the leads over the gap.

69. The method of claim 68, wherein the leads do not extend into the gap.

70. The method of claim 68, further comprising depositing a dielectric material into the gap.

71. The method of claim 70, further comprising curing the dielectric material in the gap.

72. A method for producing an electronic device, comprising:
  forming leads directly in contact with a substrate; and
  coupling the leads to connectors of a microstructure;
  wherein the forming and the coupling are parts of a direct metallizing of the leads in contact with the connectors;
  wherein the forming and the coupling also include forming an antenna and coupling the leads to the antenna; and
  wherein the direct metallizing includes plating to form the leads and the antenna.

73. The method of claim 72, wherein the plating includes electroless plating.

74. The method of claim 72, wherein the forming includes forming the antenna and leads as a single structure.

* * * * *